(12) United States Patent
Wang et al.

(10) Patent No.: US 9,122,159 B2
(45) Date of Patent: Sep. 1, 2015

(54) COMPOSITIONS AND PROCESSES FOR PHOTOLITHOGRAPHY

(75) Inventors: Deyan Wang, Hudson, MA (US); Chunyi Wu, Shrewsbury, MA (US)

(73) Assignee: Rohm and Haas Electronic Materials LLC

( * ) Notice: Subject to any disclaimer, the term of this patent is extended or adjusted under 35 U.S.C. 154(b) by 55 days.

(21) Appl. No.: 13/445,442

(22) Filed: Apr. 12, 2012

(65) Prior Publication Data

US 2012/0264053 A1    Oct. 18, 2012

Related U.S. Application Data

(60) Provisional application No. 61/475,661, filed on Apr. 14, 2011.

(51) Int. Cl.
*G03F 7/11* (2006.01)
*G03F 7/004* (2006.01)
*G03F 7/20* (2006.01)

(52) U.S. Cl.
CPC .............. *G03F 7/11* (2013.01); *G03F 7/0046* (2013.01); *G03F 7/2041* (2013.01)

(58) Field of Classification Search
None
See application file for complete search history.

(56) References Cited

U.S. PATENT DOCUMENTS

| | | | |
|---|---|---|---|
| 8,241,832 B2 | 8/2012 | Wang et al. | |
| 2006/0275697 A1 | 12/2006 | Hata et al. | |
| 2007/0212646 A1 | 9/2007 | Gallagher et al. | |
| 2008/0311506 A1* | 12/2008 | Allen et al. | 430/270.1 |
| 2008/0311530 A1 | 12/2008 | Allen et al. | |
| 2009/0136878 A1 | 5/2009 | Kanna | |
| 2010/0021852 A1* | 1/2010 | Nishimura et al. | 430/324 |
| 2010/0183976 A1* | 7/2010 | Wang et al. | 430/270.1 |
| 2010/0183977 A1* | 7/2010 | Wang et al. | 430/270.1 |
| 2011/0207051 A1* | 8/2011 | Sanders et al. | 430/285.1 |

FOREIGN PATENT DOCUMENTS

| | | |
|---|---|---|
| EP | 1 806 370 | 7/2007 |
| EP | 2 062 950 | 5/2009 |
| EP | 2 078 983 | 7/2009 |
| EP | 2 204 392 | 7/2010 |

OTHER PUBLICATIONS

Sanders, et al, "Self-segregating materials for immersion lithography"; Proceedings of the SPIE, Feb. 25, 2008, pp. 692309-1-692309-12, vol. 6923.
Chinese Search Report of corresponding Chinese Application No. 201210189046.3; correspondence mailed Dec. 17, 2013.
European Search Report of corresponding European Application No. 12163989.2; Completion date Jun. 29, 2012.
Taiwan Search Report of corresponding Taiwan Application No. 101113157; Completion date Dec. 16, 2013.

* cited by examiner

*Primary Examiner* — Cynthia H Kelly
*Assistant Examiner* — Anna Malloy

(57) ABSTRACT

Topcoat layer compositions suitable for use in forming a topcoat layer over a layer of photoresist include: a matrix polymer which is aqueous alkali soluble; a first additive of mer which is aqueous alkali soluble and comprises polymerized units of a monomer of the following general formula (I):

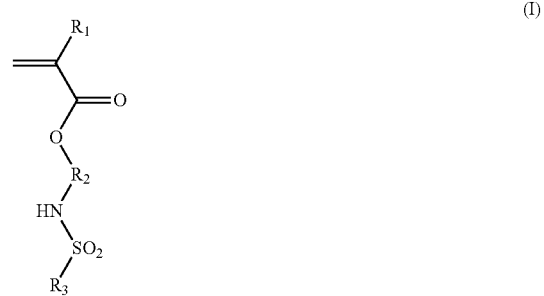

(I)

wherein: $R_1$ is hydrogen or a C1 to C6 alkyl or fluoroalkyl group; $R_2$ is a C3 to C8 branched alkylene group; and $R_3$ is a C1 to C4 fluoroalkyl group; and wherein the first additive polymer is present in the composition in an amount less than the matrix polymer, and the first additive polymer has a lower surface energy than a surface energy of the matrix polymer; wherein a layer of the topcoat composition in a dried state has a water receding contact angle of from 75 to 85°. The compositions find particular applicability to immersion lithography processing.

15 Claims, No Drawings

COMPOSITIONS AND PROCESSES FOR PHOTOLITHOGRAPHY

This application claims the benefit of priority under 35 U.S.C. §119(e) to U.S. Provisional Application No. 61/475,661, filed Apr. 14, 2011, the entire contents of which application are incorporated herein by reference.

BACKGROUND OF THE INVENTION

1. Field of the Invention

This invention relates to topcoat layer compositions that may be applied above a photoresist composition. The invention finds particular applicability as a topcoat layer in an immersion lithography process for the formation of semiconductor devices.

2. Description of the Related Art

Photoresists are photosensitive films used for transfer of an image to a substrate. A coating layer of a photoresist is formed on a substrate and the photoresist layer is then exposed through a photomask to a source of activating radiation. The photomask has areas that are opaque to the activating radiation and other areas that are transparent to the activating radiation. Exposure to activating radiation provides a photo-induced chemical transformation of the photoresist coating to thereby transfer the pattern of the photomask to the photoresist coated substrate. Following exposure, the photoresist is developed by contact with a developer solution to provide a relief image that permits selective processing of the substrate.

One approach to achieving nanometer (nm)-scale feature sizes in semiconductor devices is to use shorter wavelengths of light. However, the difficulty in finding materials that are transparent below 193 nm has led to the immersion lithography process to increase the numerical aperture of the lens by use of a liquid to focus more light into the film. Immersion lithography employs a relatively high refractive index fluid between the last surface of an imaging device (e.g., KrF or ArF light source) and the first surface on the substrate, for example, a semiconductor wafer.

In immersion lithography, direct contact between the immersion fluid and photoresist layer can result in leaching of components of the photoresist into the immersion fluid. This leaching can cause contamination of the optical lens and bring about a change in the effective refractive index and transmission properties of the immersion fluid. In an effort to ameliorate this problem, use of a topcoat layer over the photoresist layer as a barrier between the immersion fluid and underlying photoresist layer has been proposed. The use of topcoat layers in immersion lithography, however, presents various challenges. Topcoat layers can affect, for example, the process window, critical dimension (CD) variation and resist profile depending on characteristics such as topcoat refractive index, thickness, acidity, chemical interaction with the resist and soaking time. In addition, use of a topcoat layer can negatively impact device yield due, for example, to micro-bridging defects which prevent proper resist pattern formation.

To improve performance of topcoat materials, the use of self-segregating topcoat compositions to form a graded topcoat layer has been proposed, for example, in *Self-segregating Materials for Immersion Lithography*, Daniel P. Sanders et al, Advances in Resist Materials and Processing Technology XXV, Proceedings of the SPIE, Vol. 6923, pp. 692309-1-692309-12 (2008). A self-segregated topcoat would theoretically allow for a tailored material having desired properties at both the immersion fluid and photoresist interfaces, for example, a high water receding contact angle at the immersion fluid interface and good developer solubility at the photoresist interface.

Topcoats exhibiting a low receding contact angle for a given scan speed can result in water mark defects. These defects are generated when water droplets are left behind as the exposure head moves across the wafer. As a result, resist sensitivity becomes altered due to leaching of resist components into the water droplets, and water can permeate into the underlying resist. Topcoats having high receding contact angles would therefore be desired to allow for operation of immersion scanners at greater scan speeds, thereby allowing for increased process throughput.

There is a continuing need in the art for improved self-segregating topcoat compositions for use in immersion lithography, and for their methods of use.

SUMMARY OF THE INVENTION

Provided are new topcoat compositions and processes for immersion photolithography. Also provided are new compositions that can be used as an overcoat layer above a photoresist layer for use in non-immersion imaging processes. In accordance with a first aspect of the invention, provided are compositions suitable for use in forming a topcoat layer over a layer of photoresist. The compositions comprise: a matrix polymer which is aqueous alkali soluble; a first additive polymer which is aqueous alkali soluble and comprises polymerized units of a monomer of the following general formula (I):

wherein: $R_1$ is hydrogen or a C1 to C6 alkyl or fluoroalkyl group; $R_2$ is a C3 to C8 branched alkylene group; and $R_3$ is a C1 to C4 fluoroalkyl group; and wherein the first additive polymer is present in the composition in an amount less than the matrix polymer, and the first additive polymer has a lower surface energy than a surface energy of the matrix polymer; wherein a layer of the topcoat composition in a dried state has a water receding contact angle of from 75 to 85°.

In accordance with a further aspect of the invention, provided are coated substrates. The coated substrates comprise: a photoresist layer on a substrate; and a topcoat layer comprising a topcoat composition as described herein on the photoresist layer.

In accordance with a further aspect of the invention, methods of processing a photoresist composition are provided. The methods comprise: (a) applying a photoresist composition over a substrate to form a photoresist layer; (b) applying over the photoresist layer the composition of any of claims 1 to 6 to form a topcoat layer; and (c) exposing the topcoat layer and the photoresist layer to actinic radiation.

DETAILED DESCRIPTION OF THE INVENTION

Topcoat layer compositions of the invention that are applied above a photoresist composition layer are self-segregating, which can help at least to inhibit, and preferably to minimize or prevent, migration of components of the photoresist layer into an immersion fluid employed in an immersion lithography process. In addition, the water dynamic contact angle characteristics at the immersion fluid interface, such as the water receding angle, can be improved. Still further, the topcoat layer compositions provide topcoat layers having excellent developer solubility for both exposed and unexposed regions of the layer, for example, in an aqueous base developer.

As used herein, the term "immersion fluid" means a fluid (e.g., water) interposed between a lens of an exposure tool and a photoresist coated substrate to conduct immersion lithography.

Also as used herein, a topcoat layer will be considered as inhibiting the migration of photoresist material into an immersion fluid if a decreased amount of acid or organic material is detected in the immersion fluid upon use of the topcoat composition relative to the same photoresist system that is processed in the same manner, but in the absence of the topcoat composition layer. Detection of photoresist material in the immersion fluid can be conducted through mass spectroscopy analysis of the immersion fluid before exposure to the photoresist (with and without the overcoated topcoat composition layer) and then after lithographic processing of the photoresist layer (with and without the overcoated topcoat composition layer) with exposure through the immersion fluid. Preferably, the topcoat composition provides at least a 10 percent reduction in photoresist material (e.g., acid or organics as detected by mass spectroscopy) residing in the immersion fluid relative to the same photoresist that does not employ any topcoat layer (i.e., the immersion fluid directly contacts the photoresist layer), more preferably the topcoat composition provides at least a 20, 50, or 100 percent reduction in photoresist material residing in the immersion fluid relative to the same photoresist that does not employ a topcoat layer.

In certain aspects, one or more polymers of the topcoat composition will have two distinct repeat units (copolymers), three distinct repeat units (terpolymers), four distinct repeat units (tetra-polymers), five distinct repeat units (pentapolymers), or even higher order polymers.

Typical polymers of the topcoat compositions of the invention may contain a variety of repeat units, including repeat units including, for example, one or more: hydrophobic groups; weak acid groups; strong acid groups; branched optionally substituted alkyl or cycloalkyl groups; fluoroalkyl groups; or polar groups, such as ester, ether, carboxy, or sulfonyl groups.

In certain aspects, one or more polymers of the coating composition will comprise one or more groups that are reactive during lithographic processing, for example, one or more photoacid labile groups that can undergo cleavage reactions in the presence of acid and heat, such as acid-labile ester groups (e.g., t-butyl ester groups such as provided by polymerization of t-butyl acrylate or t-butylmethacrylate, adamantylacrylate) and/or acetal groups such as provided by polymerization of a vinyl ether compound.

The topcoat compositions of the invention may comprise a variety of materials, and typical polymers of the compositions are higher molecular weight materials such as materials having a molecular weight in excess of about 3000, 4000 or 4500 daltons. One or more polymers of the compositions can have a molecular weight in excess of 6000, 7000, 8000 or 9000 daltons.

The topcoat compositions of the invention may comprise one or more optional components in addition to the polymer components, for example: one or more acid generator compounds such as one or more thermal acid generator (TAG) compounds and/or one or more photoacid generator (PAG) compounds; and one or more surfactant compounds.

Methods and compositions of the invention can be used with a variety of imaging wavelengths, for example, radiation having a wavelength of less than 300 nm such as 248 nm or less than 200 such as 193 nm.

Topcoat Compositions

Topcoat compositions of the invention can exhibit favorable static and dynamic water contact angles. The topcoat compositions of the invention include two or more, preferably three or more, different polymers. Polymers useful in the invention may be homopolymers, but more typically include a plurality of distinct repeat units, with two or three distinct units, i.e., copolymers or terpolymers, being typical. The polymers are aqueous alkali soluble such that a topcoat layer formed from the composition can be removed in the resist development step using an aqueous alkaline developer, for example, a quaternary ammonium hydroxide solution, for example, tetra methyl ammonium hydroxide (TMAH).

A variety of polymers may be employed in the topcoat compositions of the invention, including polymers comprising polymerized acrylate groups, polyesters, and other repeat units and/or polymer backbone structures such as provided by, for example, poly(alkylene oxide), poly(meth)acrylic acid, poly(meth)acrylamides, polymerized aromatic (meth) acrylates, and polymerized vinyl aromatic monomers. Typically, the polymers each include at least two differing repeat units, more preferably, at least two of the first, second and third polymers include at least three differing repeat units. The different polymers suitably may be present in varying relative amounts.

The polymers of the topcoat compositions of the invention may contain a variety of repeat units, including repeat units including, for example, one or more: hydrophobic groups; weak acid groups; strong acid groups; branched optionally substituted alkyl or cycloalkyl groups; fluoroalkyl groups; or polar groups, such as ester, ether, carboxy, or sulfonyl groups. The presence of particular functional groups on the repeat units of the polymers will depend, for example, on the intended functionality of the polymer.

In certain preferred aspects, one or more polymers of the coating composition will comprise one or more groups that are reactive during lithographic processing, for example, one or more photoacid-acid labile groups that can undergo cleavage reactions in the presence of acid and heat, such as acid-labile ester groups (e.g., t-butyl ester groups such as provided by polymerization of t-butyl acrylate or t-butylmethacrylate, adamantylacrylate) and/or acetal groups such as provided by polymerization of a vinyl ether compound. The presence of such groups can render the associated polymer(s) more soluble in a developer solution, thereby aiding in developability and removal of the topcoat layer during a development process.

The polymers of the topcoat compositions typically have relatively high molecular weights, for example, in excess of about 3000, 4000 or 4500, daltons. One or more polymers of the compositions can have a molecular weight in excess of 6000, 7000, 8000 or 9000 daltons.

The polymer system of the inventive topcoat compositions include three or more distinct polymers. The polymers can advantageously be selected to tailor characteristics of the topcoat layer, with each generally serving a particular purpose or function. Such functions include, for example, one or more of photoresist profile adjusting, topcoat surface adjusting, reducing defects and reducing interfacial mixing between the topcoat and photoresist layers. Preferable polymer systems of the invention include a matrix polymer, generally the polymer present in the composition in the largest proportion on an individual basis and typically forming a major portion of the topcoat film, and two or more additive polymers. At least one additive polymer is present for surface adjusting purposes, for example, for improving immersion fluid contact angle characteristics. A second additive polymer is present for tuning of the resist feature profile and control of resist top loss.

Exemplary such polymers useful in the invention will now be described. The matrix polymer may include, for example, one or more repeating units, with two repeating units being typical. The matrix polymer should provide a sufficiently high developer dissolution rate for reducing overall defectivity due, for example, to micro-bridging. The matrix polymer may include, for example, a sulfonamide-containing monomer for enhancing the polymer developer dissolution rate. A typical developer dissolution rate for the matrix polymer is greater than 500 nm/second. The matrix polymers typically are fluorinated for reducing or minimizing interfacial mixing between the topcoat layer and underlying photoresist. One or more repeating unit of the matrix polymer can be fluorinated, for example, with a fluoroalkyl group such as a C1 to C4 fluoroalkyl group, typically fluoromethyl.

Exemplary matrix polymers in accordance with the invention include the following:

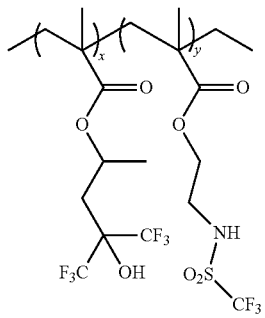

wherein x is from 0 to 90 wt % (weight percent) and y is from 10 to 100 wt %, based on the weight of the polymer. In an exemplary first matrix polymer, x/y is 90/10 wt %;

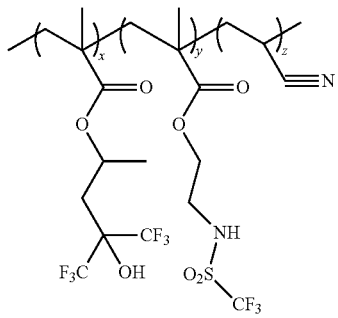

wherein x is from 0 to 85 wt %, y is from 10 to 80 wt % and z is from 5 to 20 wt % based on the weight of the polymer. In an exemplary matrix polymer, x/y/z are 40/45/15 wt %; and

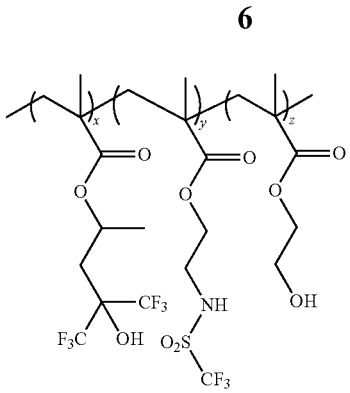

wherein x is from 0 to 85 wt %, y is from 10 to 80 wt % and z is from 5 to 20 wt % based on the weight of the polymer. In an exemplary matrix polymer, x/y/z are 40/45/15 wt %.

A first additive polymer is provided in the topcoat composition to improve surface properties at the topcoat/immersion fluid interface. In particular, the first additive polymer beneficially provides an increased immersion fluid receding contact angle at the topcoat/immersion fluid interface, thereby allowing for faster scanning speeds. A layer of the topcoat composition in a dried state has a water receding contact angle of from 75 to 85°. The phrase "in a dried state" means containing 8 wt % or less of solvent, based on the entire composition.

The first additive polymer should have a significantly lower surface energy than and be substantially immiscible with the matrix polymer and other additive polymers present in the system. In this way, the topcoat layer can be self-segregating, wherein the first additive polymer migrates to the surface of the topcoat layer apart from other polymers during coating. The resulting topcoat layer is thereby rich in the first additive polymer at the topcoat/immersion fluid interface. This polymer typically has excellent developability both before and after photolithographic treatment, and typically exhibits a dark field developer dissolution rate, for example, of 1 Å/second or higher.

The first additive polymer is aqueous alkali soluble and comprises polymerized units of a monomer of the following general formula (I):

wherein: $R_1$ is hydrogen or a C1 to C6 alkyl, preferably methyl, or fluoroalkyl group; $R_2$ is a C3 to C8 branched alkylene group, preferably, having two or more branched carbon atoms; and $R_3$ is a C1 to C4 fluoroalkyl group such as fluoromethyl or fluoroethyl.

It is believed that the monomer of general formula (I) can provide improved dark field developer dissolution rate while maintaining a high receding contact angle. Suitable monomers of general formula (I) include, for example,

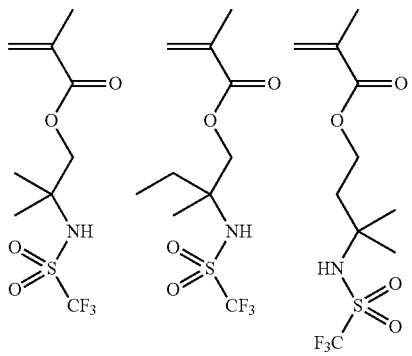

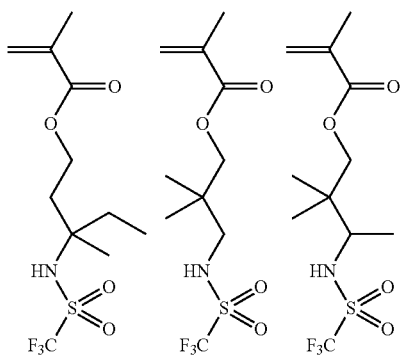

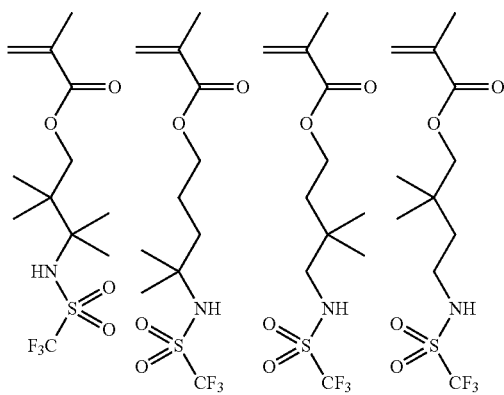

The first additive polymer may further include one or more additional units, for example, fluoroalcohol group-containing units for purposes of enhancing developer solubility and/or units having one or more acid labile functional groups to enhance solubility in a developer solution after processing the photoresist, for example, after exposure to activating radiation and post-exposure baking. Exemplary additional units for use in the first additive polymer in accordance with the invention include polymerized units of a monomer of the following general formula (II) and/or of a monomer of the following general formula (III):

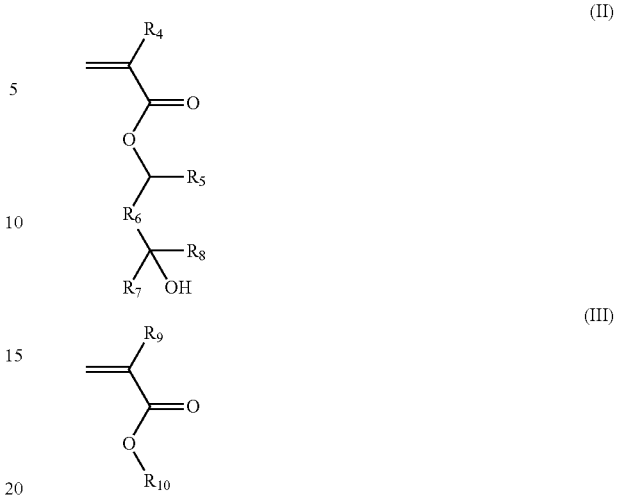

wherein: $R_4$ and $R_9$ are independently hydrogen or a C1 to C6 alkyl or fluoroalkyl; $R_5$ is an optionally substituted C3 to C10 cycloalkyl such as cyclohexyl or C3 to C10 branched alkyl group, for example, an isoalkyl group such as isopropyl or isobutyl; $R_6$ is an optionally substituted C1 to C6 alkylene group, preferably methylene or ethylene; $R_7$ and $R_8$ are each independently a C1 to C4 fluoroalkyl group, preferably trifluoromethyl; and $R_{10}$ is an acid labile leaving group, preferably having a low activation energy, for example those having a branched alkyl structure. Preferably, the first additive polymer includes polymerized units of monomers of both general formulae (II) and (III).

It is believed that monomers of general formula (II) allows for enhanced dynamic contact angles, for example, increased receding angle and decreased sliding angle, and for improving developer affinity and solubility. Suitable monomers of general formula (II) include, for example, the following:

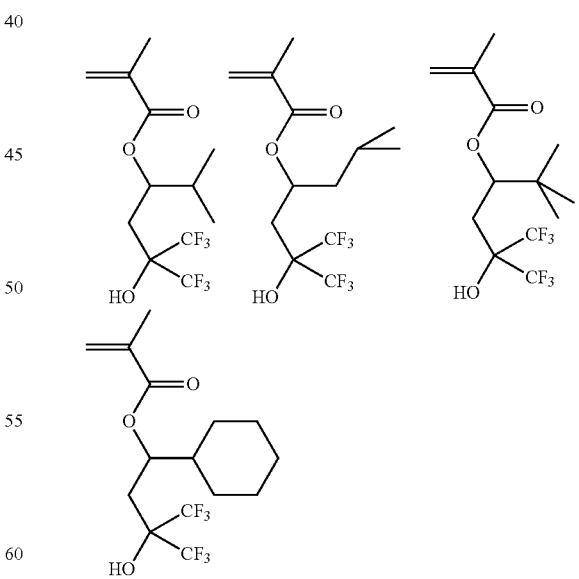

Monomers of general formula (III) are believed to provide for enhanced developer dissolution in exposed areas due to the acid-labile groups, as well as improved dynamic contact angles. Suitable monomers of general formula (III) include, for example, the following:

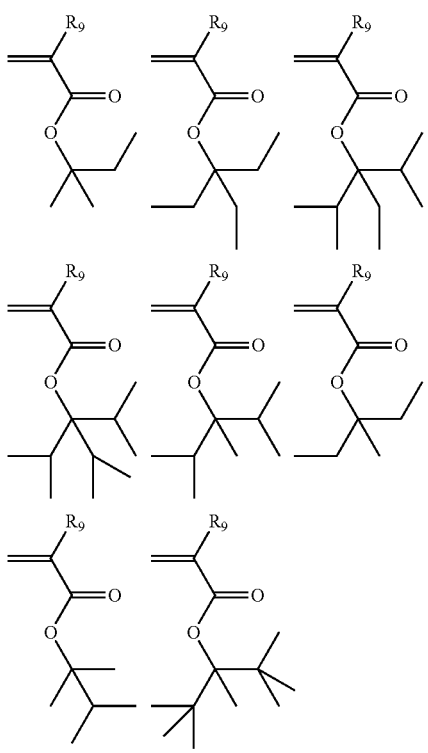

wherein $R_9$ is as defined above with respect to the monomer of general Formula (I).

Exemplary polymers useful in the invention as the first additive polymer include the following:

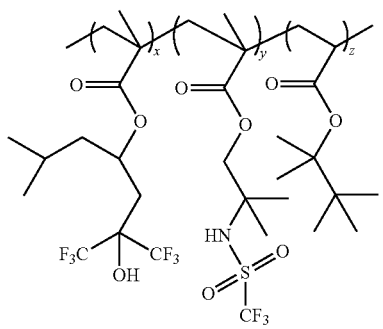

wherein x is from 0 to 89 wt %, y is from 10 to 80 wt % and z is from 5 to 30 wt % based on the weight of the polymer. In exemplary polymers, x/y/z are 50/25/25, 55/25/20 and 65/25/10 wt %.

A second additive polymer is preferably provided in addition to the matrix polymer and first additive polymer, typically for purposes of tuning the resist feature profile and for controlling resist top loss. The second additive polymer typically includes one or more strong acid functional groups, for example, a sulfonic acid group. The second additive polymer should be miscible with the matrix polymer while, as discussed above, generally immiscible with the first additive polymer.

Exemplary polymers useful in the invention as the second additive polymer include the following:

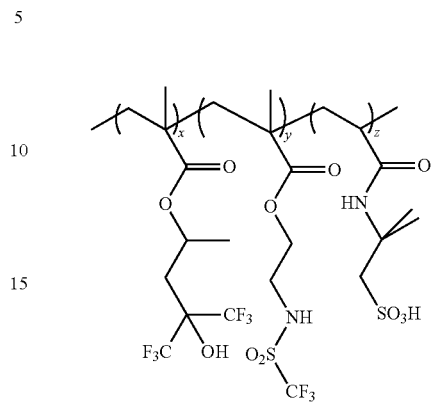

wherein x is from 0 to 89 wt %, y is from 10 to 99 wt % and z is from 1 to 5 wt % based on the weight of the polymer. In an exemplary polymer, x/y/z are 10/85/5 wt %;

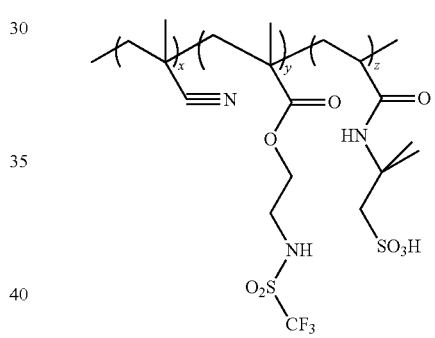

wherein x is from 5 to 20 wt %, y is from 75 to 94 wt % and z is from 1 to 5 wt % based on the weight of the polymer. In an exemplary polymer, x/y/z are 15/80/5 wt %;

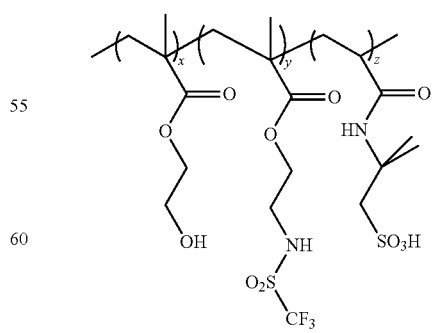

wherein x is from 5 to 20 wt %, y is from 75 to 94 wt % and z is from 1 to 5 wt % based on the weight of the polymer;

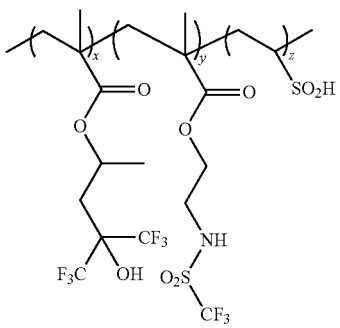

wherein x is from 0 to 89 wt %, y is from 10 to 99 wt % and z is from 1 to 5 wt % based on the weight of the polymer. In an exemplary polymer, x/y/z are 10/87/3 wt %;

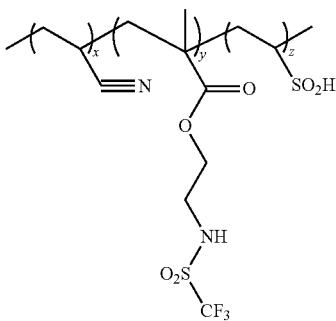

wherein x is from 5 to 20 wt %, y is from 75 to 94 wt % and z is from 1 to 5 wt % based on the weight of the polymer. In an exemplary polymer, x/y/z are 15/82/3 wt %; and

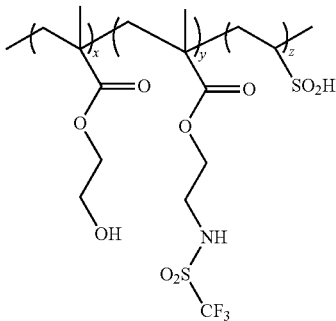

wherein x is from 5 to 20 wt %, y is from 75 to 94 wt % and z is from 1 to 5 wt % based on the weight of the polymer. In an exemplary polymer, x/y/z are 10/87/3 wt %.

As discussed above, the topcoat compositions may contain one or more acid generator compounds, for example, one or more thermal acid generator compounds and/or one or more photoacid generator compounds. Optionally, the topcoat compositions may be free of such acid generator compounds. In this regard, acid generator compounds can be provided by migration from the underlying photoresist into the topcoat layer during processing making their separate addition as part of the topcoat compositions unnecessary. Suitable thermal acid generators include ionic or substantially neutral thermal acid generators, for example, an ammonium arenesulfonate salt. Suitable PAGs are known in the art of chemically ampli-fied photoresists and include, for example: onium salts, for example, triphenyl sulfonium salts, nitrobenzyl derivatives, sulfonic acid esters, diazomethane derivatives, glyoxime derivatives, sulfonic acid ester derivatives of an N-hydroxy-imide compound and halogen-containing triazine compounds. If employed, the one or more acid generators may be utilized in relatively small amounts in a topcoat composition, for example, 0.1 to 8 wt % of the total of the dry components of the composition (all components except solvent carrier), such as about 2 wt % of the total dry components. Such use of one or more acid generator compounds can favorably impact lithographic performance, particularly resolution, of the developed image patterned in an underlying resist layer.

Preferred topcoat composition layers will have an index of refraction of about 1.4 or greater at 193 nm including about 1.47 or greater at 193 nm. Additionally, for any particular system, the index of refraction can be tuned by changing the composition of one or more polymers of the topcoat composition, including by altering the ratio of components of a polymer blend, or composition of any of the polymer(s) of a topcoat composition. For instance, increasing the amount of organic content in a topcoat layer composition can provided increased refractive index of the layer.

Preferred topcoat layer compositions will have a refractive index between of the immersion fluid and the refractive index of the photoresist at the target exposure wavelength, for example, 193 nm or 248 nm.

Typical solvent materials to formulate and cast a topcoat composition are any which dissolve or disperse the components of the topcoat layer composition but do not appreciably dissolve an underlying photoresist layer. More particularly, suitable solvents to formulate a topcoat composition include one or more of, but are not limited to, alcohols such as n-butanol, alkylene glycols, such as propylene glycol. Alternatively non-polar solvents such as aliphatic and aromatic hydrocarbons, and alkyl ethers such as dodecane, isooctane and isopentyl ether may be used. One or more solvent in the solvent system can individually be in a substantially pure form, meaning isomers of the solvent molecule are present in that solvent in an amount less than 5 wt %, for example, less than 2 wt % or less than 1 wt %. Optionally, the solvent can include a mixture of isomers of the solvent molecule, wherein the isomers are present in an amount greater than 5 wt %, for example, greater than 10 wt %, greater than 20 wt %, greater than 40 wt %, greater than 60 wt %, greater than 80 wt % or greater than 90 wt %. Preferably, a mixture of different solvents, for example, two, three or more solvents, is used to achieve effective phase separation of the segregating, first additive polymer from other polymer(s) in the composition and to reduce the viscosity of the formulation which allows for reduction in the dispense volume.

In an exemplary aspect, a three-solvent system can be used in the topcoat compositions of the invention. The solvent system can include, for example, a primary solvent, a thinner solvent and an additive solvent. The primary solvent typically exhibits excellent solubility characteristics with respect to the non-solvent components of the topcoat composition. While the desired boiling point of the primary solvent will depend on the other components of the solvent system, the boiling point is typically less than that of the additive solvent, with a boiling point of from 120 to 140° C. such as about 130° C. being typical. Suitable primary solvents include, for example, C4 to C8 n-alcohols, such as n-butanol, isobutanol, 2-methyl-1-butanol, isopentanol, 2,3-dimethyl-1-butanol, 4-methyl-2-pentanol, isohexanol and isoheptanol, isomers thereof and mixtures thereof. The primary solvent is typically present in an amount of from 30 to 80 wt % based on the solvent system.

The thinner solvent is present to lower the viscocity and improve coating coverage at a lower dispensing volume. The thinner solvent is typically a poorer solvent for the non-solvent components of the composition relative to the primary solvent. While the desired boiling point of the thinner solvent will depend on the other components of the solvent system, a boiling point of from 140 to 180° C. such as about 170° C. is typical. Suitable thinner solvents include, for example, alkanes such as C8 to C12 n-alkanes, for example, n-octane, n-decane and dodecane, isomers thereof and mixtures of isomers thereof; and/or alkyl ethers such as those of the formula $R_1$—O—$R_2$, wherein $R_1$ and $R_2$ are independently chosen from $C_2$ to $C_8$ alkyl, $C_2$ to $C_6$ alkyl and $C_2$ to $C_4$ alkyl. The alkyl ether groups can be linear or branched, and symmetric or asymmetric. Particularly suitable alkyl ethers include, for example, isobutyl ether, isopentyl and isobutyl isohexyl, isomers thereof and mixtures thereof. The thinner solvent is typically present in an amount of from 10 to 70 wt % based on the solvent system.

The additive solvent is present to facilitate phase separation between the phase segregation polymer and other polymer(s) in the topcoat composition to facilitate a self-segregating topcoat structure. In addition, the higher boiling point additive solvent can reduce the tip drying effect during coating. It is typical for the additive solvent to have a higher boiling point than the other components of the solvent system. While the desired boiling point of the additive solvent will depend on the other components of the solvent system, a boiling point of from 170 to 200° C. such as about 190° C. is typical. Suitable additive solvents include, for example, hydroxy alkyl ethers, such as those of the formula:

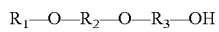

$$R_1\text{—O—}R_2\text{—O—}R_3\text{—OH}$$

wherein $R_1$ is an optionally substituted C1 to C2 alkyl group and $R_2$ and $R_3$ are independently chosen from optionally substituted C2 to C4 alkyl groups, and mixtures of such hydroxy alkyl ethers including isomeric mixtures. Exemplary hydroxy alkyl ethers include dialkyl glycol mono-alkyl ethers and isomers thereof, for example, diethylene glycol monomethyl ether, dipropylene glycol monomethyl ether, isomers thereof and mixtures thereof. The additive solvent is typically present in an amount of from 3 to 15 wt % based on the solvent system.

A particularly suitable three-solvent system includes 4-methyl-2-pentanol/isopentyl ether/dipropylene glycol monomethyl ether in a ratio by weight of 49/45/6. While the exemplary solvent system has been described with respect to a three-component system, it should be clear that additional solvents may be used. For example, one or more additional primary solvent, thinner solvent, additive solvent and/or other solvent may be employed.

A topcoat or composition may be suitably prepared by admixture of the polymers into one or more polar solvents such as those identified above or alternatively one or more non-polar solvents such as the aliphatic and aromatic hydrocarbons identified above. The viscosity of the entire composition is typically from 1.5 to 2 centipoise (cp).

The examples which follows provide exemplary preparations of topcoat compositions of the invention.

Photoresists

A wide variety of photoresist compositions may be used in combination with topcoat layer compositions and processes of the invention.

As discussed above, typical photoresists for use in accordance with the invention include positive-acting or negative-acting chemically amplified photoresists, i.e., positive-acting resist compositions which undergo a photoacid-promoted deprotection reaction of acid labile groups of one or more composition components to render exposed regions of a coating layer of the resist more soluble in an aqueous developer than unexposed regions, and negative-acting resist compositions which undergo a photoacid-promoted crosslinking reaction to render exposed regions of a coating layer of the resist less developer soluble than unexposed regions. Of these, positive-acting materials are typical. Ester groups that contain a tertiary non-cyclic alkyl carbon (e.g., t-butyl) or a tertiary alicyclic carbon (e.g., methyladamantyl) covalently linked to the carboxyl oxygen of the ester are often preferred photoacid-labile groups of polymers employed in photoresists of lithography systems of the invention. Acetal photoacid-labile groups also will be preferred.

The photoresists useful in accordance with the invention typically comprise a polymer component and a photoactive component. Typically, the polymer has functional groups that impart alkaline aqueous developability to the resist composition. For example, typical are resin binders that comprise polar functional groups such as hydroxyl or carboxylate. Typically, a polymer component is used in a resist composition in an amount sufficient to render the resist developable with an aqueous alkaline solution.

For imaging at wavelengths greater than 200 nm, such as 248 nm, phenolic resins are typical. Typical phenolic resins are poly(vinylphenols) which may be formed by block polymerization, emulsion polymerization or solution polymerization of the corresponding monomers in the presence of a catalyst. Vinylphenols useful for the production of polyvinyl phenol resins may be prepared, for example, by hydrolysis of commercially available coumarin or substituted coumarin, followed by decarboxylation of the resulting hydroxy cinnamic acids. Useful vinylphenols may also be prepared by dehydration of the corresponding hydroxy alkyl phenols or by decarboxylation of hydroxy cinnamic acids resulting from the reaction of substituted or nonsubstituted hydroxybenzaldehydes with malonic acid. Preferred polyvinylphenol resins prepared from such vinylphenols have a molecular weight range of from about 2,000 to about 60,000 daltons.

Other typical resins that have acid-labile deblocking groups for use in a positive-acting chemically-amplified photoresist of the invention have been disclosed in European Published Application EP0829766A2 (resins with acetal and ketal resins) and European Published Application EP0783136A2 (terpolymers and other copolymers including units of 1) styrene; 2) hydroxystyrene; and 3) acid labile groups, particularly alkyl acrylate acid labile groups such as t-butylacrylate or t-butylmethacrylate). In general, resins having a variety of acid labile groups will be suitable, such as acid sensitive esters, carbonates, ethers, imides, etc. The photoacid labile groups will more typically be pendant from a polymer backbone, although resins that have acid labile groups that are integral to the polymer backbone also may be employed.

For imaging at sub-200 nm wavelengths such as 193 nm, a typical photoresist contains one or more polymers that are substantially, essentially or completely free of phenyl or other aromatic groups. For example, for sub-200 nm imaging, typical photoresist polymers contain less than about 5 mole percent (mole %) aromatic groups, more typically less than about 1 or 2 mole % aromatic groups, more typically less than about 0.1, 0.02, 0.04 and 0.08 mole % aromatic groups, and still more typically less than about 0.01 mole % aromatic groups. Particularly useful polymers are completely free of aromatic groups. Aromatic groups can be highly absorbing of sub-200 nm radiation and thus are generally undesirable for polymers used in photoresists imaged with such short wavelength radiation.

Suitable polymers that are substantially or completely free of aromatic groups and may be formulated with a PAG to provide a photoresist for sub-200 nm imaging are disclosed in European Published Application EP930542A1 and U.S. Pat. Nos. 6,692,888 and 6,680,159.

Suitable polymers that are substantially or completely free of aromatic groups suitably contain acrylate units such as photoacid-labile acrylate units as may be provided by polymerization of methyladamanatylacrylate, methyladamantylmethacrylate, ethylfenchylacrylate, ethylfenchylmethacrylate, and the like; fused non-aromatic alicyclic groups such as may be provided by polymerization of a norbornene compound or other alicyclic compound having an endocyclic carbon-carbon double bond; an anhydride such as may be provided by polymerization of maleic anhydride and/or itaconic anhydride; and the like.

Negative-acting photoresist compositions useful in the invention comprise a mixture of materials that will cure, crosslink or harden upon exposure to acid, and a photoactive component of the invention. Particularly useful negative acting compositions comprise a resin binder such as a phenolic resin, a crosslinker component and a photoactive component. Such compositions and the use thereof have been disclosed in European Patent Nos. 0164248B1 and 0232972B1, and in U.S. Pat. No. 5,128,232. Typical phenolic resins for use as the resin binder component include novolaks and poly(vinylphenol)s such as those discussed above. Typical crosslinkers include amine-based materials, including melamine, glycolurils, benzoguanamine-based materials and urea-based materials. Melamine-formaldehyde resins are generally most typical. Such crosslinkers are commercially available, for example: the melamine resins sold by Cytec Industries under the trade names Cymel 300, 301 and 303; glycoluril resins sold by Cytec Industries under the trade names Cymel 1170, 1171, 1172; urea-based resins sold by Teknor Apex Company under the trade names Beetle 60, 65 and 80; and benzoguanamine resins sold by Cytec Industries under the trade names Cymel 1123 and 1125.

For imaging at sub-200 nm wavelengths such as 193 nm, typical negative-acting photoresists are disclosed in International Application Pub. No. WO 03077029.

The resin component of resists useful in the invention are typically used in an amount sufficient to render an exposed coating layer of the resist developable such as with an aqueous alkaline solution. More particularly, a resin binder will suitably comprise 50 to about 90 wt % of total solids of the resist. The photoactive component should be present in an amount sufficient to enable generation of a latent image in a coating layer of the resist. More specifically, the photoactive component will suitably be present in an amount of from about 1 to 40 wt % of total solids of a resist. Typically, lesser amounts of the photoactive component will be suitable for chemically amplified resists.

The resist compositions useful in the invention also comprise a PAG employed in an amount sufficient to generate a latent image in a coating layer of the resist upon exposure to activating radiation. Suitable PAGs are described above with reference to the topcoat compositions.

A typical optional additive of the resists is an added base, particularly tetrabutylammonium hydroxide (TBAH), or tetrabutylammonium lactate, which can enhance resolution of a developed resist relief image. For resists imaged at 193 nm, a typical added base is a hindered amine such as diazabicyclo undecene or diazabicyclononene. The added base is suitably used in relatively small amounts, for example, about 0.03 to 5 wt % relative to the total solids.

Photoresists used in accordance with the invention also may contain other optional materials. For example, other optional additives include anti-striation agents, plasticizers and speed enhancers. Such optional additives typically will be present in minor concentrations in a photoresist composition except for fillers and dyes which may be present in relatively large concentrations, for example, in amounts of from about 5 to 30 wt % based on the total weight of a resist's dry components.

The photoresists useful in the invention are generally prepared following known procedures. For example, a resist of the invention can be prepared as a coating composition by dissolving the components of the photoresist in a suitable solvent, for example, a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between 5 and 35 wt % based on the total weight of the photoresist composition. Blends of such solvents also are suitable.

Lithographic Processing

Liquid photoresist compositions can be applied to a substrate such as by spin coating, dipping, roller coating or other conventional coating technique, with spin coating being typical. When spin coating, the solids content of the coating solution can be adjusted to provide a desired film thickness based upon the specific spinning equipment utilized, the viscosity of the solution, the speed of the spinner and the amount of time allowed for spinning.

Photoresist compositions used in accordance with the invention are suitably applied to substrates conventionally used in processes involving coating with photoresists. For example, the composition may be applied over silicon wafers or silicon wafers coated with silicon dioxide for the production of microprocessors and other integrated circuit components. Aluminum-aluminum oxide, gallium arsenide, ceramic, quartz, copper, glass substrates and the like may also be suitably employed. Photoresists also may be suitably applied over an antireflective layer, particularly an organic antireflective layer.

A topcoat composition of the invention can be applied over the photoresist composition by any suitable method such as described above with reference to the photoresist compositions, with spin coating being typical.

Following coating of the photoresist onto a surface, it may be dried by heating to remove the solvent until typically the photoresist coating is tack free, or as discussed above, the photoresist layer may be dried after the topcoat layer composition has been applied and the solvent from both the photoresist composition and topcoat composition layers substantially removed in a single thermal treatment step.

The photoresist layer with topcoat composition layer is then exposed to patterned radiation activating for the photoactive component of the photoresist.

In an immersion lithography system, the space between the exposure tool (particularly the projection lens) and the photoresist coated substrate is occupied by an immersion fluid, such as water or water mixed with one or more additives such as cesium sulfate which can provide a fluid of enhanced refractive index. Typically, the immersion fluid (e.g., water) has been treated to avoid bubbles, for example, degassing the water to avoid nanobubbles.

References herein to "immersion exposing" or other similar term indicates that exposure is conducted with such a fluid layer (e.g. water or water with additives) interposed between an exposure tool and the coated photoresist composition layer. During the exposure step (whether immersion where fluid is interposed, or non-immersion where such fluid is not interposed), the photoresist composition layer is exposed to patterned activating radiation with the exposure energy typically ranging from about 1 to 100 mJ/cm$^2$, dependent upon the exposure tool and the components of the photoresist composition. References herein to exposing a photoresist composition to radiation that is activating for the photoresist indicates that the radiation is capable of forming a latent image in the photoresist such as by causing a reaction of the photoactive component, for example, producing photoacid from a photoacid generator compound.

As discussed above, photoresist compositions may be photoactivated by a short exposure wavelength, particularly a sub-300 and sub-200 nm exposure wavelength, with 248 nm and 193 nm being particularly preferred exposure wavelengths, as well as EUV and 157 nm. Following exposure, the film layer of the composition is typically baked at a temperature ranging from about 70° C. to about 160° C.

Thereafter, the film is developed, typically by treatment with an aqueous base developer chosen from quaternary ammonium hydroxide solutions such as a tetra-alkyl ammonium hydroxide solutions; amine solutions, typically a 0.26 N tetramethylammonium hydroxide such as ethyl amine, n-propyl amine, diethyl amine, di-n-propyl amine, triethyl amine, or methyldiethyl amine; alcohol amines such as diethanol amine or triethanol amine; and cyclic amines such as pyrrole or pyridine. In general, development is in accordance with procedures recognized in the art.

Following development of the photoresist coating over the substrate, the developed substrate may be selectively processed on those areas bared of resist, for example by chemically etching or plating substrate areas bared of resist in accordance with procedures known in the art. For the manufacture of microelectronic substrates, for example, the manufacture of silicon dioxide wafers, suitable etchants include a gas etchant such as a halogen plasma etchant such as a chlorine- or fluorine-based etchant such a $Cl_2$ or $CF_4/CHF_3$ etchant applied as a plasma stream. After such processing, resist may be removed from the processed substrate using known stripping procedures.

The following non-limiting examples are illustrative of the invention.

EXAMPLES

Polymer Synthesis

The following polymers were synthesized as described below:

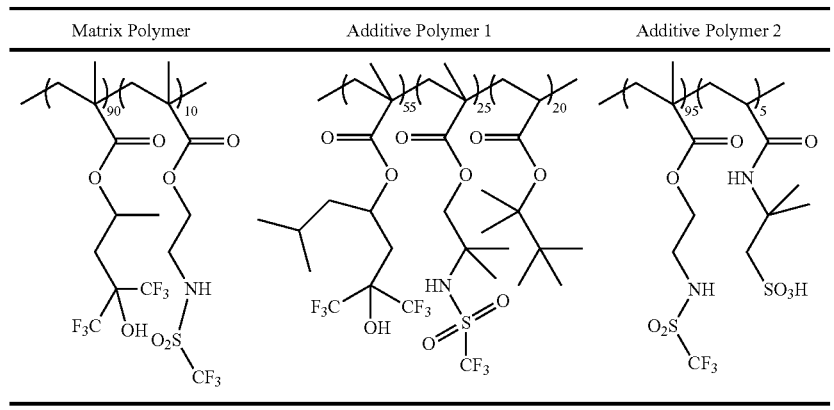

Example 1

Matrix Polymer Synthesis

Monomer A=4,4,4-trifluoro-3-hydroxy-1-methyl-3-(trifluoromethyebutyl 2-methacrylate
Monomer B=2{[(trifluoromethyl)sulfonyl]amino}ethyl 2-methacrylate 9.0 g of Monomer A, 1.0 g of Monomer B and 17.0 g of 4-methyl-2-pentanol (MIBC) were added to a vessel. The container was shaken to dissolve the two monomers. The container was next placed in an ice bath to reach temperature equilibrium with the bath. 0.3 g of Vazo™ 52 initiator (DuPont) was added to the container, the container was shaken to dissolve the initiator and the container was returned to the ice bath. 30 g of 4-methyl-2-pentanol was charged into a 100 ml 3-neck, round bottom flask with a magnetic stir bar and a heating control thermocouple, and was heated to 85° C. with stirring. The monomer/initiator solution was fed into the reactor at a feed rate of 4.17 μl/second (~90 minutes feeding time). After feeding, the reactor temperature was maintained at 85° C. for an additional 2 hours, and the reactor was then allowed to cool naturally to room temperature. The polymer solution was found to have a concentration of 10.9 wt % and about 10 g of the matrix polymer resulted.

Example 2

First Additive Polymer Synthesis

Monomer C=1,1,1-trifluor-2-hydroxy-6-methyl-2-(trifluoromethyl)heptane-4-yl methacrylate
Monomer D=2-trifluoromethylsulfonylamin0-2-methylpropyl methacrylate
Monomer E=2,3,3-trimethylbutyl acrylate 33.0 g of Monomer C, 15.0 g of Monomer D, 12.0 g of Monomer E and 30.0 g of propylene glycol methyl ether acetate (PGMEA) were added to a vessel. The container was shaken to dissolve the monomers. The container was next placed in an ice bath to reach temperature equilibrium with the bath. 1.80 g of Vazo™ 67 initiator (DuPont) was added to the container, the container was shaken to dissolve the initiator and the container was returned to the ice bath. 30 g of PGMEA was charged into a 250 ml 3-neck, round bottom flask with a magnetic stir bar and a heating control thermocouple, and was heated to 97° C. with stirring. The monomer/initiator solution was fed into the reactor at a feed rate of 19.2 μl/sec (~70 minutes feeding time). After feeding, the reactor temperature was maintained at 97° C. for an additional 2 hours, and the reactor was then allowed to cool naturally to room temperature. The polymer solution was found to have a concentration of 50.3 wt % and about 60 g of the first additive polymer resulted.

Example 3

Second Additive Polymer Synthesis

Monomer B=2{[(trifluoromethyl)sulfonyl]amino}ethyl 2-methacrylate
Monomer F=2-Acrylamido-2-Methyl-1-propanesulfonic acid 9.5 g of Monomer B and 10.0 g of PGMEA were added to a vessel. The container was shaken to dissolve the monomers. 2.0 g of a 25 wt % water solution of Monomer F was added to the container. The container was shaken to obtain a uniform solution and was then placed in an ice bath to reach temperature equilibrium with the bath. 0.15 g of Vazo™ 67 initiator (DuPont) was added to the container, the container was shaken to dissolve the initiator and the container was returned to the ice bath. 20 g of PGMEA was charged into a 100 ml 3-neck, round bottom flask with a magnetic stir bar and a heating control thermocouple, and was heated to 97° C. with stirring. The monomer/initiator solution was fed into the reactor at a feed rate of 4.17 μl/sec (~90 minutes feeding time). After feeding, the reactor temperature was maintained at 85° C. for an additional 1.5 hours, and the reactor was then allowed to cool naturally to room temperature with stirring. The polymer solution was then concentrated through rotor vaporization and precipitated in DI water. The precipitated polymer was collected and vacuum dried at 45° C. The dried polymer was then dissolved in MIBC. About 10 g of the second additive polymer resulted.

Topcoat Composition Preparation

Example 4

A topcoat composition of the invention was prepared by admixing the following components in the following amounts:

| Component | Concentration | Mass (g) |
| --- | --- | --- |
| Matrix Polymer | 10.9% in MIBC | 4.19 |
| Additive Polymer 1 | 30.3% in MIBC | 1.50 |
| Additive polymer 2 | 50.3% in PGMEA | 0.206 |
| PAG* | 1% In MIBC | 0.433 |
| MIBC | 100% | 20.67 |
| Isoamyl ether | 100% | 20.0 |
| Dipropylene glycol methyl ether | 100% | 3.0 |

*PAG = (4-(2-(tert-butoxy)-2-oxoethoxy)phenyl)diphenylsulfonium nonafluoro-n-butane-sulfonate Example 5

Coating and Water Contact Angle Evaluations

The composition of Example 4 was spin coated on a dried photoresist layer (Epic™ 2096 photoresist, Rohm and Haas Electronic Materials) disposed on a silicon wafer substrate. Static ($\theta_{Static}$), receding ($\theta_{Receding}$), advancing ($\theta_{Advancing}$) and sliding ($\theta_{Sliding}$) contact angles were measured. The receding contact angle and advancing contact angle are the measured as angles between the tangent line and the wafer surface at the receding (i.e., trailing) side and advancing side, respectively, of the droplet in the first frame in which the droplet slides. The measurements were performed on a KRUSS DSA 100 Goniomer using 50 μl water droplets and at 1 unit/sec table tilting rate. After 50 μl DI water was dispensed onto a test wafer surface, the wafer stage was tilted at a rate of 1 unit/sec. During the tilting, video images were taken at a rate of at least 5 frames per second along the tilt axis. The angle of the tilting table corresponding to the first movement of the droplet was defined as the "sliding angle." The results are set forth in Table 1, below.

TABLE 1

| | Contact Angles θ (°) | | | |
| --- | --- | --- | --- | --- |
| Example | $\theta_{Static}$ | $\theta_{Receding}$ | $\theta_{Advancing}$ | $\theta_{Sliding}$ |
| Example 5 | 91.5 | 77.5 | 95.4 | 19.2 |

Immersion Lithography

The coating composition of Example 5 was spin coated onto a respective silicon wafer having a coating layer of Epic™ 2096 photoresist (Rohm and Haas Electronic Materials). The topcoat coated photoresist layer was imaged in an immersion lithography system with patterned radiation having a wavelength of 193 nm.

What is claimed is:

1. A composition suitable for use in forming a topcoat layer over a layer of photoresist, the composition comprising:
    a matrix polymer which is aqueous alkali soluble;
    a first additive polymer which is aqueous alkali soluble and comprises polymerized units of a monomer of the following general formula (I):

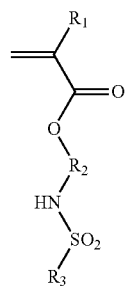

(I)

wherein: $R_1$ is hydrogen or a C1 to C6 alkyl or fluoroalkyl group; $R_2$ is a C3 to C8 branched alkylene group; and $R_3$ is a C1 to C4 fluoroalkyl group; and
   wherein the first additive polymer is present in the composition in an amount less than the matrix polymer, the first additive polymer has a lower surface energy than a surface energy of the matrix polymer and the first additive polymer is substantially immiscible with the matrix polymer; and
    a solvent system comprising a mixture of different solvents to achieve effective phase separation of the first additive polymer from other polymer(s) in the composition;

wherein a layer of the composition in a dried state has a water receding contact angle of from 75 to 85°.

2. The composition of claim 1, wherein the first additive polymer further comprises polymerized units of a monomer of the following general formula (II) and/or of a monomer of the following general formula (III):

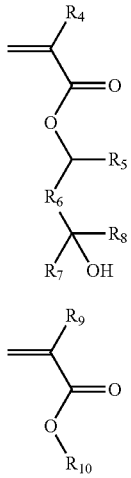

wherein: $R_4$ and $R_9$ are independently hydrogen or a C1 to C6 alkyl or fluoroalkyl; $R_5$ is an optionally substituted C3 to C10 cycloalkyl or C3 to C10 branched alkyl group; $R_6$ is an optionally substituted C1 to C6 alkylene group; $R_7$ and $R_8$ are each independently a to C4 fluoroalkyl group; and $R_{10}$ is an acid labile leaving group.

3. The composition of claim 2, wherein the first additive polymer comprises polymerized units of monomers of the general formulae (II) and (III).

4. The composition of claim 1, wherein the matrix polymer comprises one or more fluorinated groups.

5. The composition of claim 1, further comprising a second additive polymer comprising one or more strong acid groups.

6. The composition of claim 1, wherein the solvent system comprises a mixture of: an alcohol; an alkyl ether and/or an alkane; and a dialkyl glycol mono-alkyl ether.

7. A coated substrate, comprising:
a photoresist layer on a substrate; and
a topcoat layer comprising a composition of claim 1 on the photoresist layer.

8. A method of processing a photoresist composition, comprising:
(a) applying a photoresist composition over a substrate to form a photoresist layer;
(b) applying over the photoresist layer the composition of claim 1 to form a topcoat layer; and
(c) exposing the topcoat layer and the photoresist layer to actinic radiation.

9. The method of claim 8, wherein the exposure is an immersion exposure and the substrate is a semiconductor wafer.

10. The method of claim 8, wherein the topcoat layer is self-segregated.

11. The method of claim 8, wherein the first additive polymer further comprises polymerized units of a monomer of the following general formula (II) and/or of a monomer of the following general formula (III):

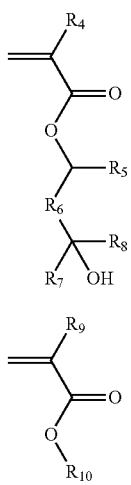

wherein: $R_4$ and $R_9$ are independently hydrogen or a C1 to C6 alkyl or fluoroalkyl; $R_5$ is an optionally substituted C3 to C10 cycloalkyl or C3 to C10 branched alkyl group; $R_6$ is an optionally substituted C1 to C6 alkylene group; $R_7$ and $R_8$ are each independently a C1 to C4 fluoroalkyl group; and $R_{10}$ is an acid labile leaving group.

12. The method of claim 11, wherein the first additive polymer comprises polymerized units of monomers of the general formulae (II) and (III).

13. The method of claim 8, wherein the matrix polymer comprises one or more fluorinated groups.

14. The method of claim 8, further comprising a second additive polymer comprising one or more strong acid groups.

15. The method of claim 8, wherein the solvent system comprises a mixture of: an alcohol; an alkyl ether and/or an alkane; and a dialkyl glycol mono-alkyl ether.

* * * * *